United States Patent [19]
Pape et al.

[11] Patent Number: 5,267,188
[45] Date of Patent: Nov. 30, 1993

[54] MULTI-CHANNEL ACOUSTO-OPTIC SPECTRUM ANALYZER

[75] Inventors: Dennis R. Pape, Satellite Beach, Fla.; James A. Carter, III, Melbourne, Fla.

[73] Assignee: Photonic Systems, Inc., Melbourne, Fla.

[21] Appl. No.: 871,850

[22] Filed: Apr. 21, 1992

[51] Int. Cl.$^5$ .............................................. G06G 7/19
[52] U.S. Cl. .................................................. 364/827
[58] Field of Search .................. 364/827, 826, 822; 359/285, 287

[56] References Cited
U.S. PATENT DOCUMENTS

| | | | |
|---|---|---|---|
| 3,738,731 | 6/1973 | Chandra et al. | 364/827 X |
| 4,729,114 | 3/1988 | Kingston et al. | 364/827 |
| 4,764,891 | 8/1988 | Grinberg et al. | 364/827 X |
| 5,167,002 | 11/1992 | Fridhandler | 364/827 X |

Primary Examiner—Tan V. Mai
Attorney, Agent, or Firm—Charles E. Wands

[57] ABSTRACT

A multi-channel acousto-optic spectrometer employs a multi-channel Bragg cell, Fourier transform imaging optics and two-dimensional charge coupled device photodetector array to simultaneously process a plurality of parallel channels of respectively adjacent frequency bands of a wideband radio frequency signal. The signal modulation and optical transmission characteristics of the spectrometer are such that the respective acousto-optic channels to which the respective sub-bands portions of the signal are applied do not interfere with one another and are imaged upon closely spaced regions of the two-dimensional photodetector array. The opto-electronic responses of the respective imaging regions of the array are transferred from an imaging area of the photodetector array, upon which a multi-channel acousto-optically modulated light beam is projected by the spectrometer's Fourier transform-imaging optics, to a non-imaging area of the photodetector array, so as to permit a new spectrometer input signal to be imaged onto the two-dimensional photodetector array. The contents of each frequency channel of a respective sub-band are then transferred in parallel to an output accumulator register, which is read out serially and digitized for application to downstream signal processing and display circuitry.

16 Claims, 12 Drawing Sheets

Upper Parallel Clocks: Inactive
Lower Parallel Clocks: Inactive
Serial Clocks: Inactive Upper Parallel Clocks: Inactive
Lower Parallel Clocks: Inactive
Serial Clocks: Active Upper Parallel Clocks: Inactive
Lower Parallel Clocks: Active
Serial Clocks: Inactive Upper Parallel Clocks: Inactive Lower Parallel Clocks: Active Serial Clocks: Inactive Upper Parallel Clocks: Inactive Lower Parallel Clocks: Inactive Serial Clocks: Active

MULTI-CHANNEL ACOUSTO-OPTIC SPECTRUM ANALYZER

FIELD OF THE INVENTION

The present invention relates in general to signal frequency content analysis instruments and is particularly directed to a wide band, real time, multi-channel acousto-optic spectrum analyzer.

BACKGROUND OF THE INVENTION

Spectrum analyzers, which provide a display of the power of the respective frequency components of a signal of interest, can be classified into one of two different types: non-real time and real time instruments. Non-real time instruments, which constitute the vast majority of spectrum analyzers currently in use, customarily employ a sweepable frequency filter or local oscillator which is scanned through the frequency band of the signal being analyzed. If the signal contains a frequency component within the sweep window, the power of that frequency component will be displayed. However, because the sweep window is moving with time, if the signal under analysis has a frequency component occurring outside of the sweep window, the component will be missed and therefore not displayed. Moreover, if the power level of a frequency component is relatively weak, so that it may be masked by noise, it would be necessary to monitor or integrate the frequency component for a period of time that exceeds the dwell time of the sweeping filter window, so that such a frequency component would again be missed.

Real time spectrum analyzers overcome the above shortcomings of swept frequency instruments by simultaneously monitoring the entire signal band of the signal, usually by means of a bank of parallel frequency filters. Current state of the art real time spectrum analyzers employ digital signal processing techniques, which sample and quantize the signal in the time domain. The resulting digitized signal is then processed by means of either a Fast Fourier Transform (FFT) filter or a Finite Impulse Response (FIR) filter to obtain a frequency response output.

The FFT instrument uses the FFT to calculate the frequency domain spectrum from the time domain data. Because of the time required to compute the FFT within size and cost constraints imposed by the instrument market (typically 6.5 ms for a 1024 point real transform), such instruments are limited to a real time bandwidth of less than 200 kHz. The FIR instrument employs a bank of parallel digital FIR filters, which have a limited response time (typically on the order of 200 microseconds per sample), so that a 1024 channel FIR filter instrument also has a relatively narrow real time bandwidth (less than 3 MHz).

SUMMARY OF THE INVENTION

In accordance with the present invention, the above discussed limitations of conventional spectrum analyzers (both non-real time and real time instruments) are effectively obviated by means of a multi-channel acousto-optic spectrometer, which employs a multi-channel Bragg cell, Fourier transform imaging optics and two-dimensional CCD photodetector array to simultaneously process a plurality of parallel channels of respectively adjacent frequency bands of a wideband (e.g. RF) signal of interest. The signal modulation and optical transmission characteristics of the spectrometer, particularly the acoustic focussing properties of the multi-channel Bragg cell, are such that the respective acousto-optic channels, to which the respective sub-bands portions of the signal are applied, do not interfere with one another and are imaged upon closely spaced regions of the two-dimensional photodetector array.

As the acousto-optically modulated light beam is imaged by the spectrometer's Fourier transform-imaging lens system onto an active imaging area of the photodetector array for a prescribed active illumination interval, there is a build-up or integration of the photo-charge response of the pixels of the photodetector array to the projected light beam. At the end of this active illumination interval, the modulated beam is turned off, either electronically at the Bragg cell feed, or optically in the light beam path. With the beam effectively turned off, the opto-electronic responses of the respective imaging regions of the array are transferred (clocked) from the active imaging area of the photodetector array to a masked, non-imaging area of the photodetector array. Once the active imaging area is cleared of the previously imaged photo-charge response (which has been transferred to the masked area of the photodetector array), it is ready to receive a new (Bragg cell modulated) image. The previously imaged opto-electronic response of the photodetector array, which currently resides in the masked area of the array, is then clocked out to downstream digital signal processing and display equipment simultaneously with the projection of a new spectrometer input signal onto the active imaging area of the photodetector array. Thus, the dual region (active illumination region - masked region) two-dimensional photodetector makes it possible to effectively 'ping-pong' the acousto-optic processing and display of sequential signals to be analyzed, thereby enhancing the throughput of the system.

DETAILED DESCRIPTION

Figure 1:
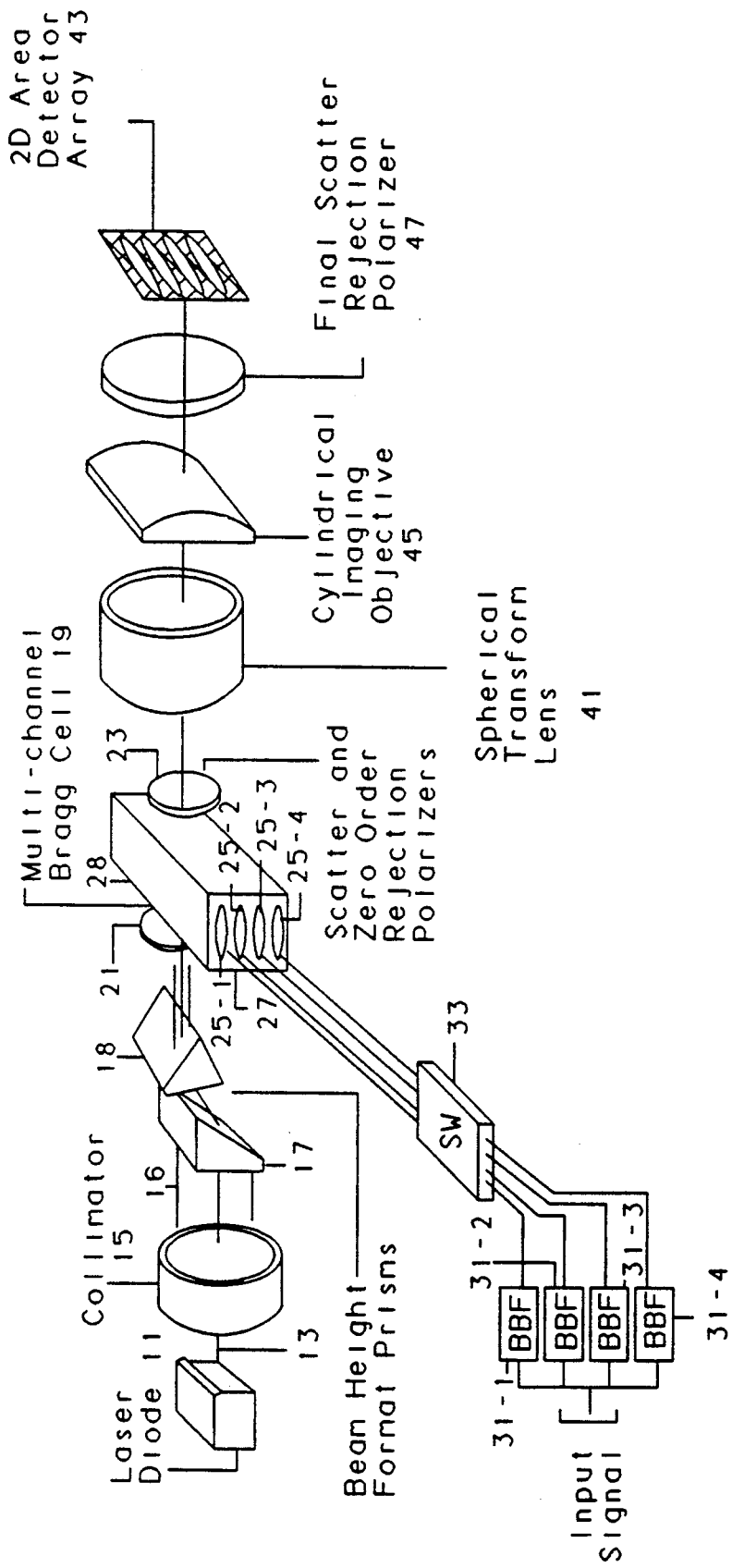
FIG. 1 is a diagrammatic illustration of the optical path architecture of a multi-channel acousto-optic spectrum analyzer in accordance with the present invention.

FIG. 1 diagrammatically illustrates the optical modulation path of the architecture of a multi-channel acousto-optic spectrum analyzer of the present invention. As a non-limitative example, the signal to be acousto-optically processed will be considered to have a spectral content covering a four GHz bandwidth, subdividable into four mutually contiguous frequency bins of one Ghz each. Each of these four frequency bins may be associated with and preliminarily extracted by way of a respective one of a set of four bandpass filters through which the signal of interest is coupled in the course of being applied to a respective channel of the acousto-optic modulator of the spectrum analyzer. It should be observed, however, that any preliminary signal processing, such as bandpass filtering, is not limited to such precursor signal processing mechanism of the type described here; other forms of preliminary signal flow paths may be employed, depending upon the type and bandwidth of the input signal. For example, each of the signals applied to the respective channels of the acousto-optic modulator may be derived from a respectively independent source, or the same signal may be applied to each of the channels (with optional precursor filtering).

The spectrum analyzer includes a coherent light beam source 11, such as a semiconductor injection laser diode, which emits a coherent light beam 13. Light beam 13 is collimated by a collimating lens 15 and directed along an optical path 16 through set of a beam height format prisms 17, 18, which effectively scale the size of the beam to be incident upon a downstream multichannel Bragg cell 19. Disposed immediately upstream and downstream of Bragg cell 19 are respective polarizers 21, 23, which reject scattered light and remove the zero order diffracted beam from the output of the Bragg cell 19. Bragg cell 19 is preferably formed of a material such as gallium phosphide (GaP) which, because of its anisotropic acoustic propagation properties, confines shear wave acoustic energy launched into the acousto-optic crystal material along a generally collimated travel path. Advantageously, this property of the GaP material makes it possible to mount a plurality (e.g. four in the illustrated embodiment) of acoustic wave launching transducers 25-1, 25-2, 25-3, 25-4 in very close proximity to one another on a common face 27 of GaP crystal 28, thereby achieving a very compact hardware configuration, while still accommodating a very substantial signal bandwidth and large time aperture.

More particularly, by using a Bragg cell crystal material such as GaP, the acoustic beams launched by transducers 25-1 ... 25-4 are highly collimated and therefore travel through the crystal along essentially parallel adjacent acoustic channels, without spread or mutual overlap in any portion intersecting the incident light beam to be modulated. The acoustic wave launching transducers 25-1 ... 25-4 may have a surface width of 50 microns and a center to center spacing of 250 microns on the face 27 of Bragg cell crystal 28. In the present example, even though each acousto-optic channel of the Bragg cell 19 is associated with a relatively wide bandwidth portion (e.g. 1000 Mhz or 1.0 GHz) of a signal to be processed, the individual acousto-optic channels will not interact with one another, even for large time apertures of up to 2.0 or 2.5 microseconds.

As pointed out above, in the present example, the (4 GHz wide) input signal is preliminarily filter-separated into four mutually adjacent frequency bins are then down-converted to the 1 GHz band of respective channels of Bragg cell 19, in the course of applying the signal to the respective channels of the acousto-optic modulator. This precursor filter is shown as a set of parallel bandpass filters 31-1, 31-2, 31-3 and 31-4, having respectively contiguous bandpass filter segments (e.g. each being 1 GHz=1000 MHz wide) covering the entire range of frequencies (e.g. 4 GHz) of the input signal. The outputs of these filters are down converted to the center frequency of the respective channels of Bragg cell 19 by a set of associated mixers (not shown for clarity).

The input signal path which, in the present example, is derived from the outputs of filters 31, is coupled through an RF signal switch 33 for controllably turning the input signal path to the respective channels of the Bragg cell on and off in the course of successive cycles of illumination of an imaging region of a downstream photodetector array. Alternatively, the optical path may be subjected to a controllable 'optical shutter' mechanism. For this purpose, coherent light source 11 may be controllably turned on and off, or a controllable mechanical shutter may be installed in the optical path. As explained briefly above, the modulation signal path is controllably cycled on and off in order to alternately image the diffracted output beams of the multi-channel Bragg cell 13 upon a light-receiving region of the photodetector array and transfer the opto-electronic response of the imaged photodetector region to a masked region of the array. During the time that the illuminated region response is being transferred to the masked region, the optical path is turned off. At the next optical imaging cycle, with the acousto-optically modulated path turned on, the previously transferred response from the masked region is read out to downstream signal processing circuitry at the same time that a new image is being formed on the non-masked area of the photodetector array. The details of these successive imaging, transfer and read-out operations of the photodetector array will be detailed below with reference to FIGS. 4-12.

A Fourier transform lens system 41 is disposed in the path 16 of the acousto-optically modulated light beam downstream of Bragg cell 19 for converting the temporal modulation information acoustically imparted to light beam 13 by the four spatially adjacent channels of Bragg cell 13 into frequency information. The respectively different spatial frequency (diffracted) components of the respective channels of the modulated beam are focussed and projected in spatially parallel channels onto respectively different spatial coordinates of a two-dimensional photodetector array 43. For this purpose, a cylindrical imaging objective lens 45 and a further scatter rejection polarizer 47 are disposed between Fourier transform lens 41 and photodetector array 43. Namely, the geometry of Fourier transform lens 41 and cylindrical imaging objective lens are such that the properties of gallium phosphide Bragg cell 19 are properly projected onto (four) spatially adjacent portions of an active, light receiving area of photodetector array 43, shown in detail in FIG. 2, to be described. Distortion is controlled so as to maintain linearity between the Bragg cell deflection angle and spot location at photodetector array 43 (for example, by invoking the so called "f-theta" condition). The angle at which diffracted light beam 13 is focussed upon the photodetector array 43 is also controlled by Fourier transform lens 41 (e.g. by invoking the telecentric condition). For all defection angles supported by the Bragg cell, Fourier transform lens 41 focusses the diffracted light beam onto the photodetector array 43 at normal incidence.

Figure 2:
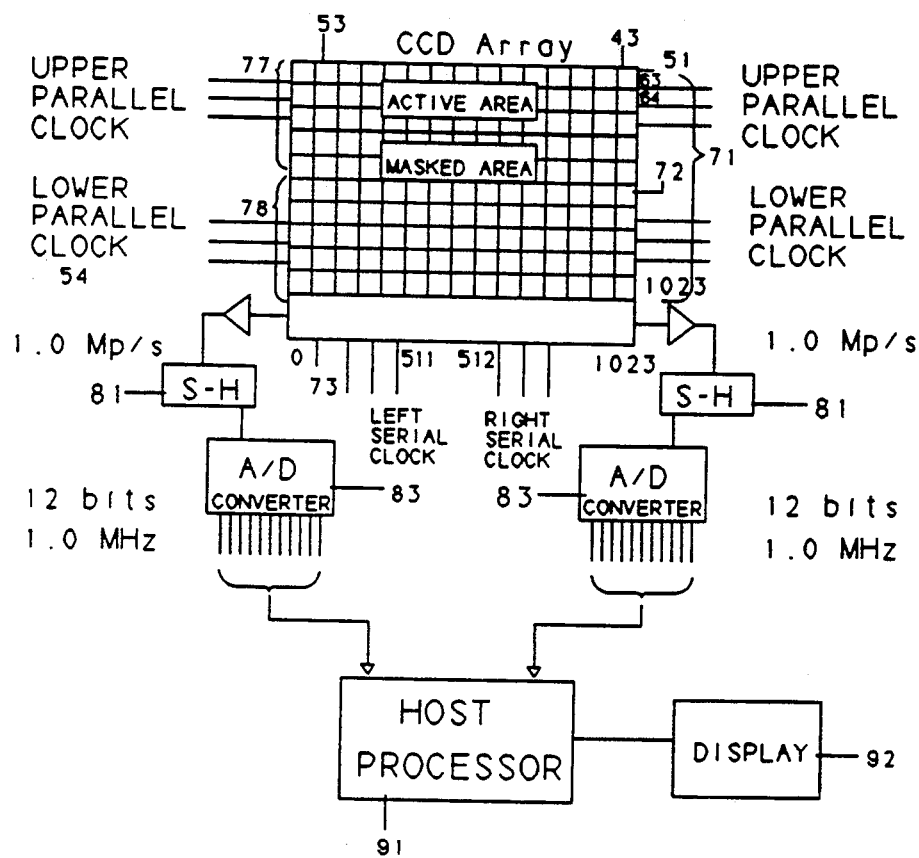
FIG. 2 diagrammatically illustrates the configuration of a two-dimensional photodetector array and an associated parallel to serial, read-out interface employed in the acousto-optic spectrum analyzer of FIG. 1.
Figure 3:
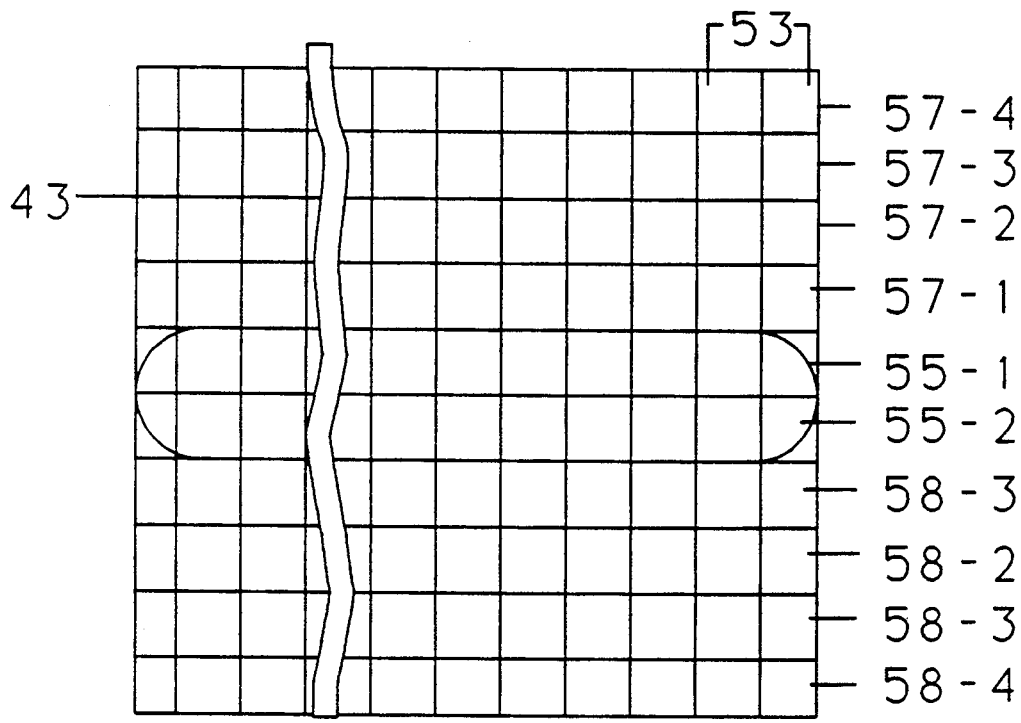
FIG. 3 shows an enlarged diagrammatic illustration of an individual channel containing two contiguous rows of CCD pixels and a plurality of 'guard band' rows of pixels on either side of the imaged rows within the active imaging region of a photodetector array of the acousto-optic spectrum analyzer of FIG. 1.

Referring now to FIG. 2, two-dimensional photodetector array 43 is shown as being configured as a two-dimensional spatial matrix 51 of charge coupled device cells or pixels 53, such as a 1024×1024 CCD array (having a pixel size 24 microns high by 24 microns wide) manufactured by Tektronix Inc., Beaverton, Oreg. Because of the above-described acoustic-collimating properties of Bragg cell crystal 19, the focussing characteristics of Fourier transform lens 41 and the dimensions of array 43, an individual acousto-optic channel may be focussed onto an active imaging region 51 of photodetector array 43 covering two contiguous or immediately adjacent rows 55-1, 55-2 of CCD pixels, as shown in the enlarged diagrammatic illustration of FIG. 3. The projection parameters of the adjacent, but spaced apart acousto-optic channels of the system (four in the present example) are such that there are approximately four rows of pixels 57-1, 57-2, 57-3, 57-4 and 58-1, 58-2, 58-3, 58-4 on either side of the imaged pair 55-1, 55-2, so as to provide guard bands of non-imaged pixels on either side of each pair of channel-imaged rows of CCD pixels 55-1, 55-2.

Figure 4:
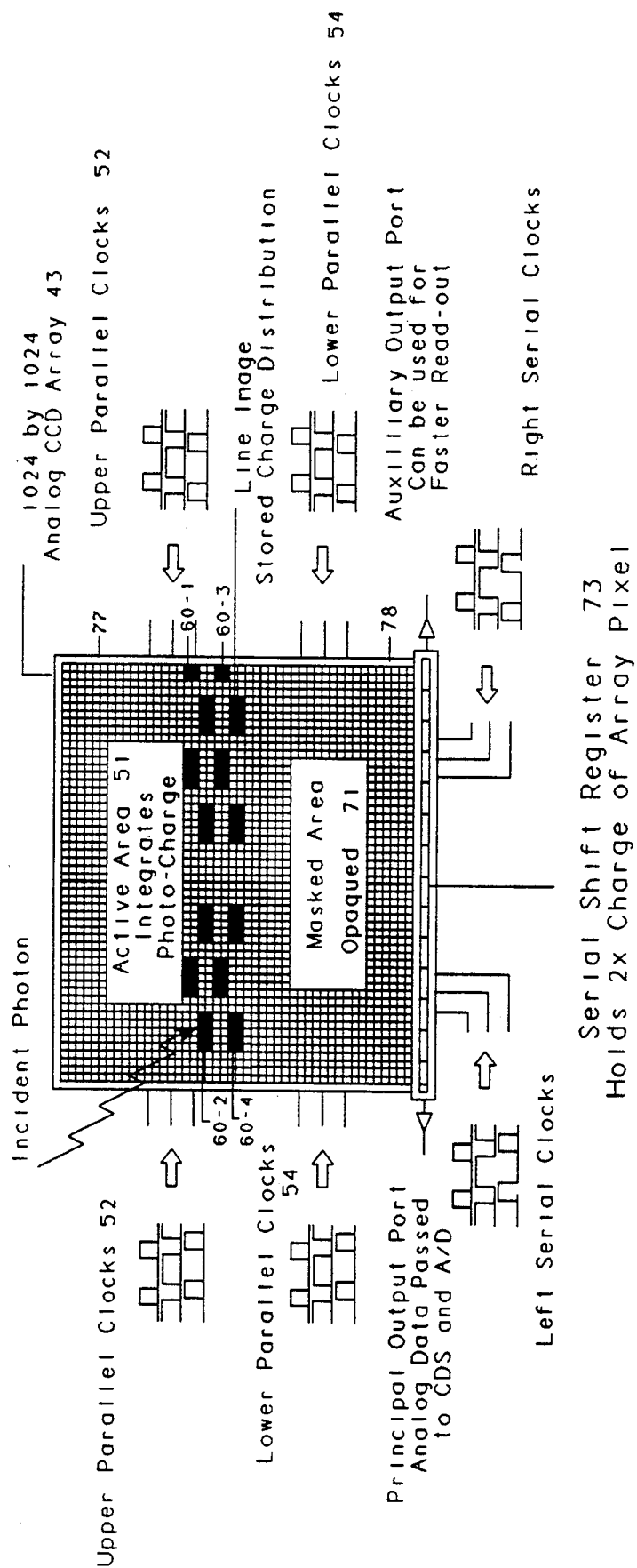
FIG. 4 shows four spatially separated portions of an acousto-optically modulated light beam imaged onto four successively adjacent segments of an active, light receiving region of a photodetector array of the acousto-optic spectrum analyzer of FIG. 1.

Thus, as diagrammatically illustrated in FIG. 4, for the four channel system of the present example, the four spatially separated portions of the acousto-optically modulated light beam 13 will be imaged onto four successively adjacent, generally line-shaped segments 60-1, 60-2, 60-3, 60-4 of an active, light receiving region 51 of an upper portion of the photodetector array 43. In order to minimize imaged signal corruption, at least the active imaging area 51 and preferably both the active imaging area 51 and the masked transfer area 71 of the photodetector array should optimally be blemish free. For purposes of a non-limitative example, a substantially blemish free set of an upper sixty-four (0-63) rows of the 1024 rows of pixels of the array may be selected to accommodate the four imaged channels (e.g. forty rows of pixels associated with the four successively adjacent segments 60-1, 60-2, 60-3, 60-4. Each segment 60-i may encompass ten successive rows of pixels, with the information of an individual acousto-optic channel being focussed upon the two central rows 55-1, 55-2 of an individual segment, as described above with reference to FIG. 3). Thus, the information receiving rows of pixels 55-1, 55-2 (which effectively form a line image of a channel) of adjacent ones of the segments 60-1, 60-2, 60-3, 60-4 are spaced apart from one another by eight buffering rows of pixels therebetween.

Immediately adjacent to the sixty-four rows of light receiving region 51 of photodetector array 43 is a region 71, which is shielded from incident light by an opaque mask. Masked region 71 encompasses the remaining rows (e.g. rows 64-1024) of pixels of the photodetector array 43 and serves as a buffer zone to which the contents of the light receiving region 51 are transferred, in preparation for read-out to a parallel-in, serial-out accumulator register 73, under the control of timing and control circuitry (preferably in the form of a state machine) which controls the operation of the system, including the clocking of photodetector array 43. Separate clocks, identified in the Figures as a set of upper parallel transfer clock signals 52 and a set of lower parallel transfer clock signals 54, are associated with upper and lower portions 77, 78 of photodetector array 43, so as to facilitate both rapid transfer of the plurality of imaged channels from the light receiving region 61 to masked region 71 and, thereafter, sequential read out of the transferred channels from the masked region 71 to an output accumulator register 73. Accumulator register 73 preferably comprises a multi-bin CCD accumulator (e.g. 1024 bins in the present example), the respective stages of which are coupled in parallel to receive the contents of the multiple (1024) columns of the lowermost row 1063 of photodetector array 43.

Figure 5:
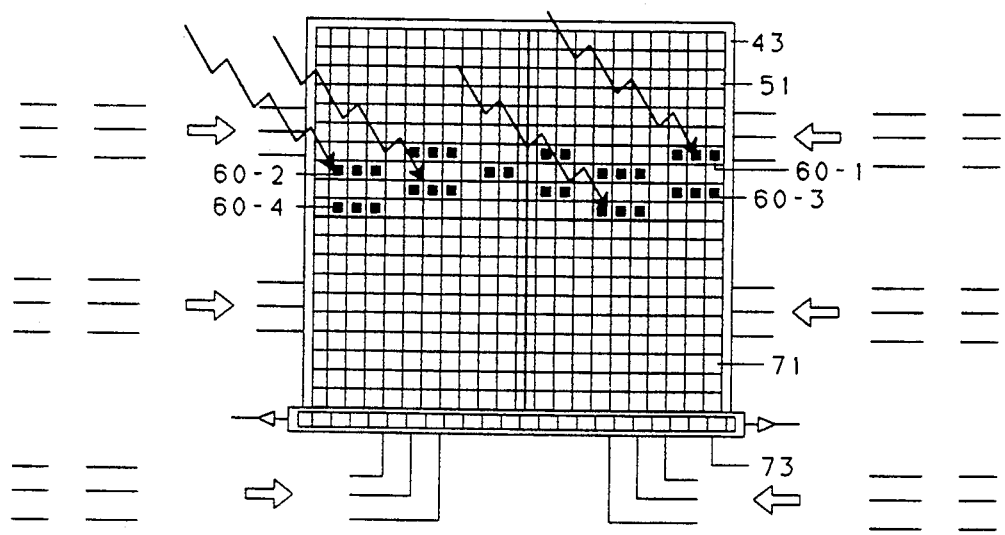
FIG. 5 shows the two lowermost rows of the photodetector array of FIG. 2 and an associated accumulator register to which the lowermost row of CCD pixels is transferred during read-out of the contents of the photodetector array.
Figure 6:
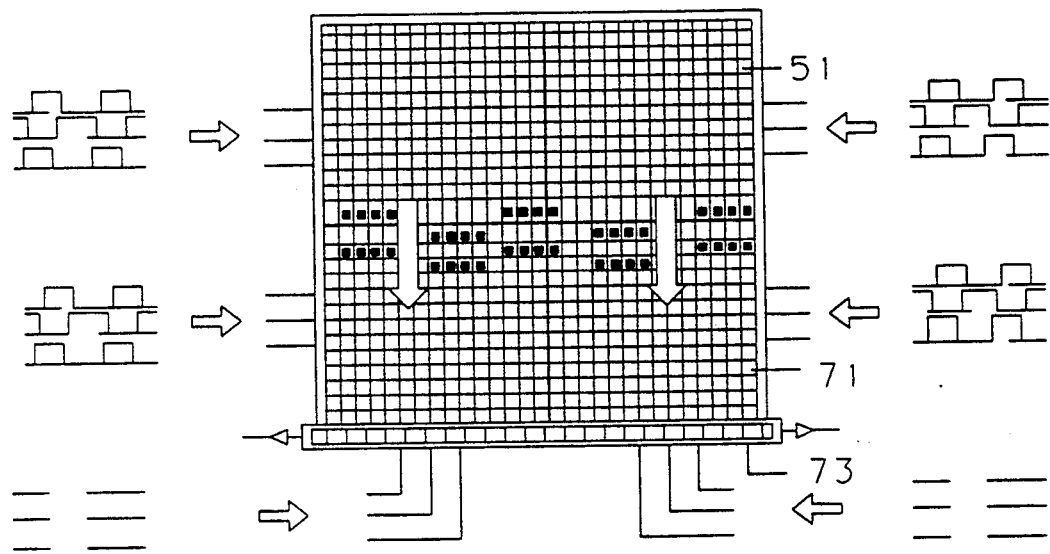
FIGS. 6-12 are diagrammatic illustrations of respective states of operation of the dual region, two dimensional photodetector array of FIG. 2 in the course of the operation of the spectrum analyzer of the present invention.

Clocking of the photodetector array is initiated when the response of the pixels of the array to the illuminating (acousto-optically modulated) beam is at about 80% of saturation. Laser 11 and the RF channel inputs to Bragg cell 19 as well as all transfer and read-out clocks (upper and lower clock signals 52 and 54) are turned off, as shown in FIG. 5. Next, as shown in FIG. 6, the upper and lower clock signals 52, 54 are enabled (are active), so that the opto-electronic responses (photonically induced charge level) of the CCD cells of the active, light-receiving region 51 are transferred to the masked region 71. Once the four response channels 60-1 . . . 60-4 have been transferred from active imaging region 51 to the masked region 71, the upper clock signals 52 are turned off, so that the active imaging region 51 may be illuminated with a newly modulated beam, as illustrated in FIG. 7.

Figure 7:
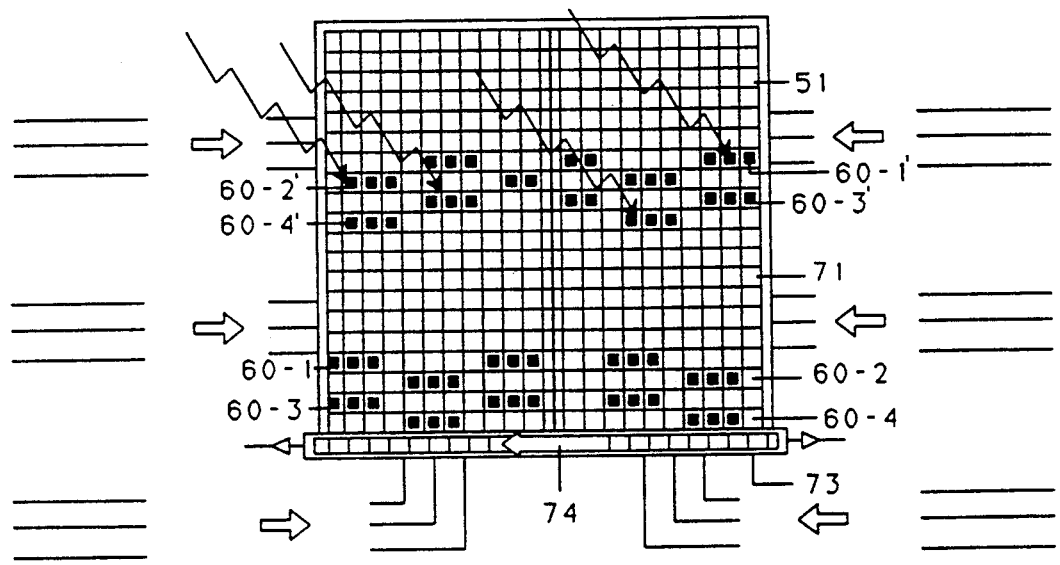

Also shown in FIG. 7 are the results of the continued clocking of the four channels 60-1 . . . 60-4, that have been transferred to masked region 71, down the parallel rows of the array, until the central rows 55-1, 55-2 of segment 60-4 (FIG. 3) occupy the two lowermost rows of pixels (1062, 1063 of the 1064 rows of the present example). At this point in the signal transfer process, a serial read-out clock applied to output register/accumulator 73 goes active, in order to 'flush' its contents (which is essentially noise), prior to outputting valid data.

Figure 8:
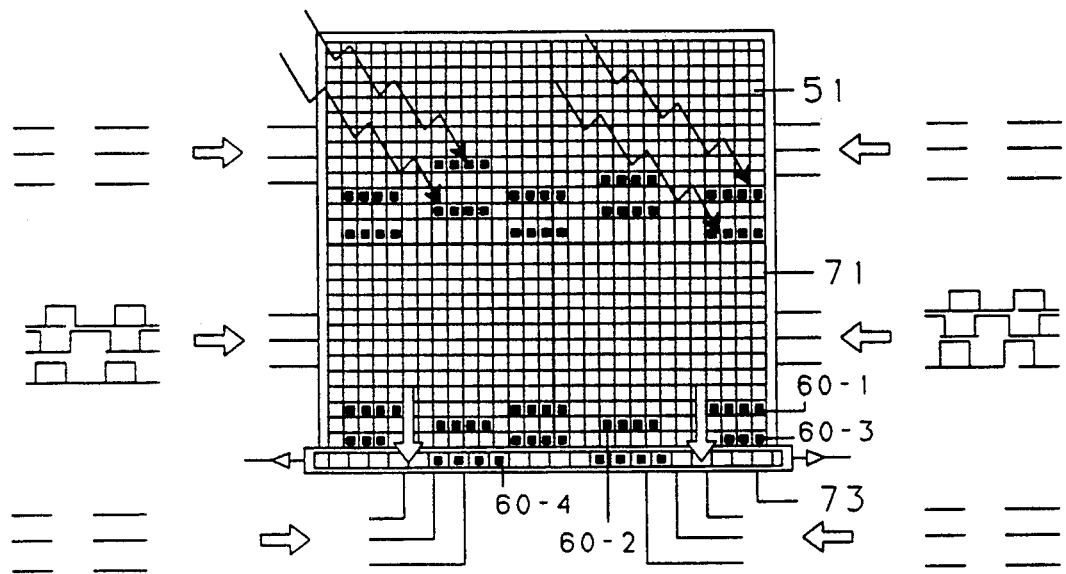

Following the serial flush operation, the lower parallel clock is turned on for two parallel transfer cycles, so that the contents of the 1024 pixels of the lowermost rows 1062 and 1063 of the 1064 row array photodetector 43 may be transferred into the 1024 stages of accumulator register 73, as shown in FIG. 8. Since the contents of both rows 1062 and 1063 are transferred into register 73, there is an effective accumulation or summation of the charge contents of each row, whereby the contents of accumulator register 73 are equal to the total charge produced by the CCD responses of the two central rows 55-1, 55-2 of an individual modulated channel corresponding to image segment 60-4. Namely, the contents of accumulator register 73 now represent the spectral content of a 1000 Mhz portion of the input signal, associated with one of the four channels (here channel 60-4) of the input signal as filtered by bandpass filters 31.

Figure 9:
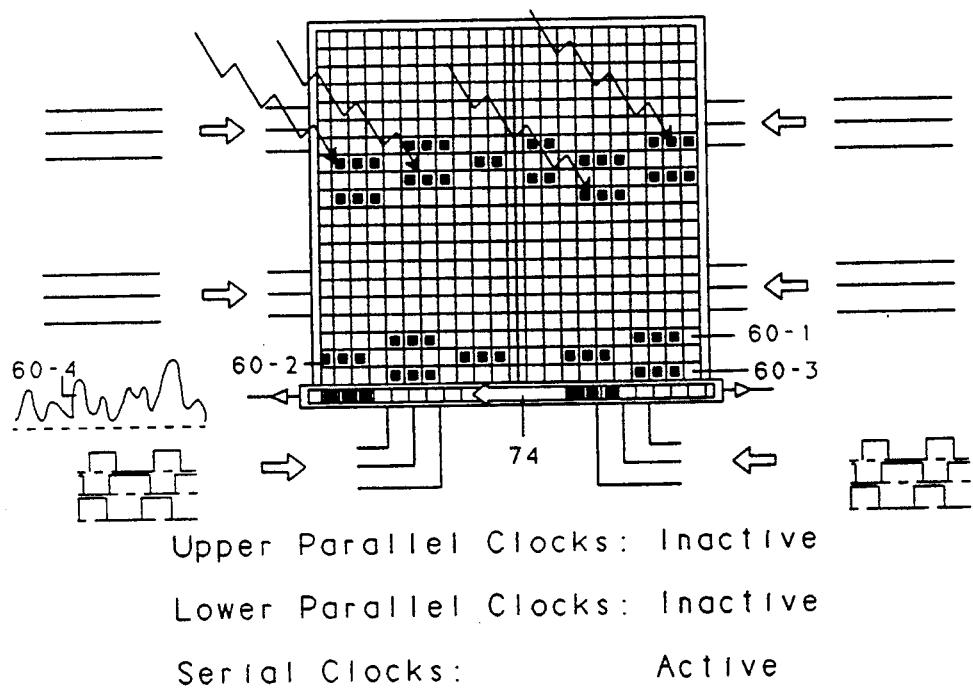

Following the downloading of channel 60-4 into output accumulator register 73, the channel photon charge representative data are then serially clocked out, as shown in FIG. 9, for application to downstream digital processing circuitry. For this purpose, the contents of accumulator register 73 may be spatially divided in half, so as to realize left and right half data segments (each encompassing 512 CCD stages or frequency bins of the 1000 MHz channel of interest) of the photodetector's output, and thereby increase data throughput speed. It should be observed that dividing the channel in half, or the use of another subframe transfer mechanism, is not a required implementation; the serial read out of accumulator register 73 may be derived from a single end, as illustrated by the arrow 74 in FIG. 9, so that all 1024 bins are read out as one sequential data stream. Subdividing the serial read out reduces processing time, as noted above.

The (analog) contents of the respective 1024 bins of output accumulator register 73 are sampled by sample and hold circuits 81 (preferably implemented as a correlated double sampling and hold circuit in order to provide a D.C. reference update) and then quantized to a prescribed digital encoding resolution (e.g. twelve bits) by analog-to-digital (A-D) converters 83. The digitized spectral information may now be stored in attendant memory of a host computer 91 for processing and display. For spectral analysis display, the data is converted into analog/numerical form and applied to an output display device (CRT) 92 for graphic rendering of the power versus frequency contents of the channel.

Figure 10:
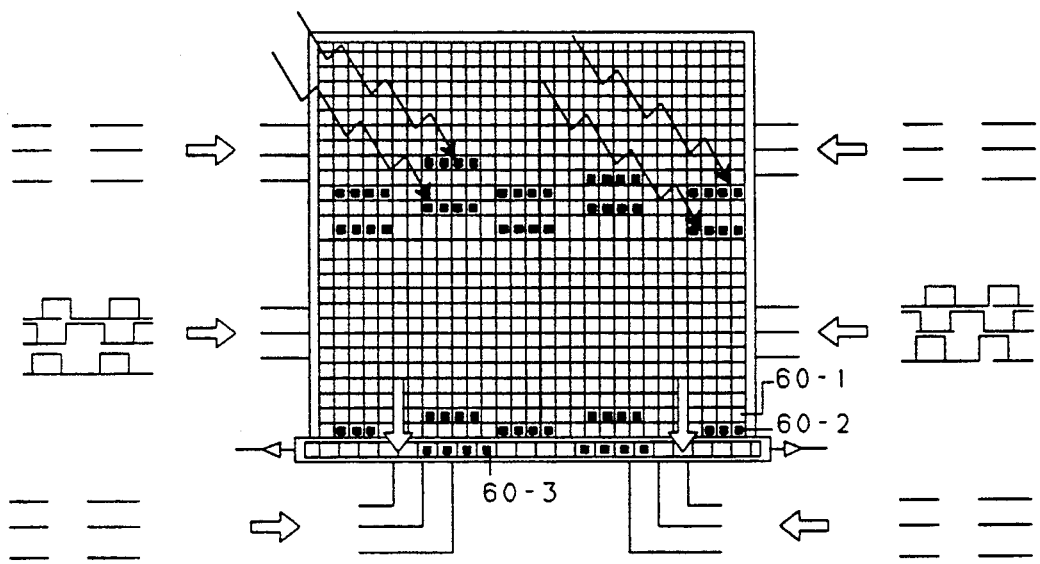
Figure 11:
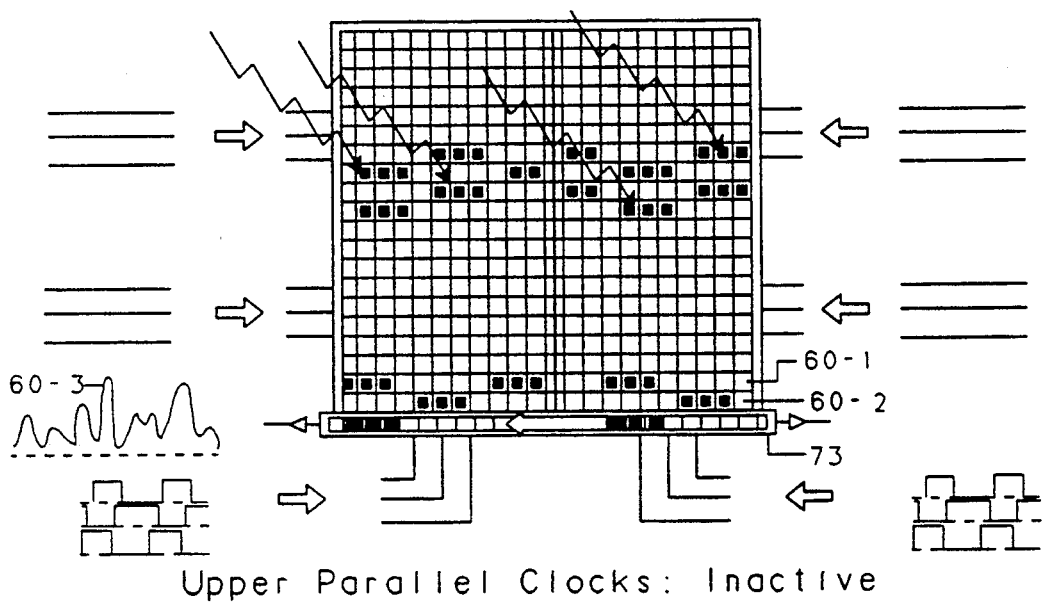
Figure 12:
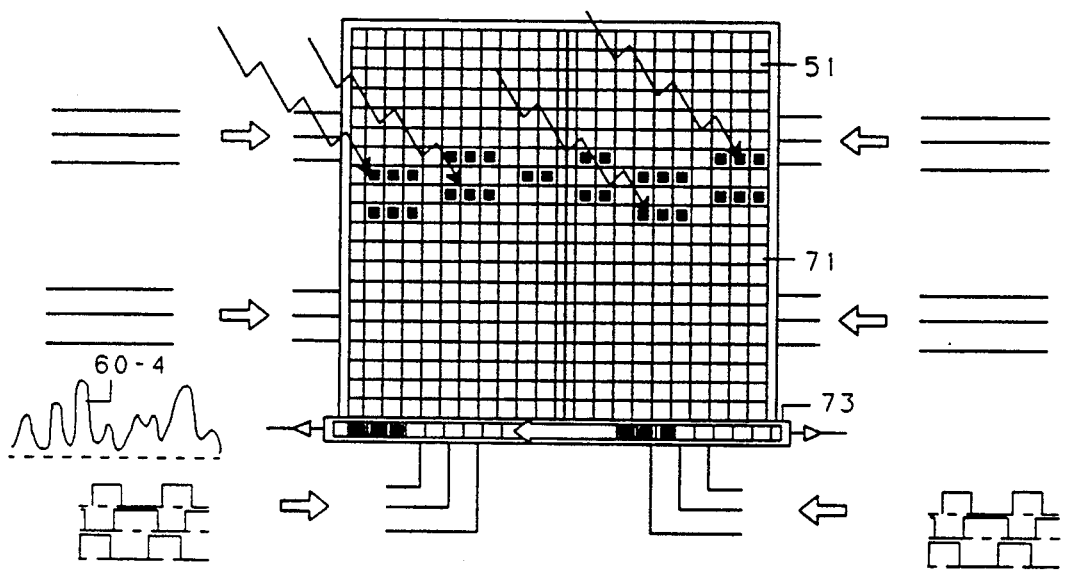

After serially clocking out channel 60-4 from accumulator register 73, the lower parallel clock 54 is again turned on (for eight clock cycles), so that the next channel 60-3 may be transferred to the lowermost rows 1062 and 1063 of photodetector array 43. Since the eight rows of guard band pixels between channels 60-4 and 60-3 are transferred and accumulated into register 73, a serial flush of register 73 is carried out just prior to downloading the next channel 60-3 into the output register. The transfer of the contents of channel 60-3 into output register 73 is illustrated in FIG. 10, while FIG. 11 illustrates the serial read-out of the downloaded contents of channel 60-3 which, in the present example, represent the spectral contents of an adjacent 1 GHz wide portion of the signal of interest. The above process is then repeated for the remaining channels 60-2 and 60-1 until all four channels have been serially clocked out of accumulator register 73, FIG. 12 illustrating the serial clocking out of channel 60-1.

As described above, and as illustrated in FIG. 7, after the contents of the respective channels of the modulated light beam that have been imaged onto photodetector array 43 have been transferred from the active, light receiving region 51 into masked region 71, light receiving region 51 may be imaged with a newly modulated light beam, shown in FIGS. 7-12 as channels 60-1'–60-4'. Namely, once the previously captured photon responses of one set of channels have been transferred to the masked region 71, so that they may be loaded into accumulator register 73, serially clocked out, digitized, and buffered in memory, light receiving region 51 may be imaged with a newly modulated light beam. Thus, as illustrated in FIGS. 7-12, during the downloading and serial read-out of channels 60-4 . . . 60-1 via output accumulator register 73, the light receiving region 51 of photodetector array 43 continues to integrate the photo response of the CCD pixels to the input image channels 60-1' . . . 60-4'. Thus, photodetector array 43 may be operated in a 'ping-pong' mode, so as to permit a new input signal to be imaged, while, at the same time, the transferred opto-electronic signal responses of its light-receiving region 51 are being read out to downstream processing circuitry.

Because each channel is digitized and stored in memory of an associated control processor, the present invention has the capability of analyzing the frequency content of signals having a very low signal to noise ratio. Not only do the plural rows of CCD sensors upon which an individual channel is imaged provide an 'on the fly' accumulation or integration of the frequency content of the signal of interest, but the availability of digital memory makes it possible to successively sum or accumulate a respective channel's frequency content by repeated acousto-optic processing of the same signal channel. As a consequence, the frequency content of very low level signals that are effectively 'buried in noise' can be readily extracted and displayed.

As will be appreciated from the foregoing description, the previously discussed limitations of conventional non-real time and real time spectrum analyzers are effectively obviated by the multi-channel acousto-optic spectrometer of the present invention, which employs a multi-channel Bragg cell, Fourier transform imaging optics and two-dimensional CCD photodetector array to simultaneously image (integrate the opto-electronic responses of the pixels of the photodetector array) and process a plurality of parallel channels of respectively adjacent frequency bands of a previously imaged wideband RF signal. The signal modulation and optical transmission characteristics of the spectrometer, particularly the acoustic focussing properties of the multi-channel Bragg cell, are such that the respective acousto-optic channels, to which the respective subbands portions of the signal are applied, do not interfere with one another and are imaged upon closely spaced regions of the two-dimensional photodetector array, so as to permit essentially noiseless processing of the frequency information.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:
1. A spectrum analyzer comprising:
    a coherent light beam source;
    an acousto-optic modulator disposed in the path of a light beam emitted by said coherent light beam source, and being coupled to receive an input signal the spectral content of which is to be ascertained, and being operative to modulate said light beam in accordance with said input signal applied thereto;
    a Fourier transform lens system disposed in the path of said light beam;
    photodetector array optically coupled to receive the light beam that has been acousto-optically modulated by said acousto-optic modulator and projected thereon by said Fourier transform lens system; and
    a photodetector read-out unit, coupled to said photodetector array, and operative to read out signals representative of the responses of respectively adjacent portions of said photodetector array, said read-out signals being representative of whatever spectral content is present in said input signal.

2. A spectrum analyzer according to claim 1, wherein said photodetector array comprises a two-dimensional photodetector.

3. A spectrum analyzer according to claim 2, wherein said two-dimensional photodetector read-out unit is operative to transfer signals representative of the optical responses of the pixels of said plurality of respectively adjacent regions of said two-dimensional array to a further region of said array masked from the optical path of said modulated light beam.

4. A spectrum analyzer according to claim 3, wherein said photodetector read-out unit comprises an output accumulator register, coupled to said further region of said array, and wherein said photodetector read-out unit is operative to couple signals representative of the responses of the pixels of a respective one of said adjacent portions of said two-dimensional photodetector array to said output accumulator register.

5. A spectrum analyzer according to claim 4, further including an output display device, and wherein said photodetector read-out unit is operative to read out the contents of said output accumulator register for display by way of said output display device.

6. A spectrum analyzer according to claim 5, wherein said photodetector read out unit is operative to sequentially transfer signals representative of the responses of the pixels of respectively adjacent portions of said two-dimensional array in sequential groups through said further region of said two-dimensional photodetector array into said output accumulator register.

7. A spectrum analyzer according to claim 2, wherein said photodetector read out unit is operative to transfer opto-electronic responses of respective imaging regions of an imaging area of said two-dimensional photodetector array, upon which a Fourier transformed acousto-optically modulated light beam is projected by said Fourier transform lens system, to a non-imaging masked area of said two-dimensional photodetector array, so as to permit a new input signal to be imaged onto said two-dimensional photodetector array at the same time that the transferred opto-electronic signal responses are being read out.

8. A spectrum analyzer according to claim 1, wherein said acousto-optic modulator comprises a multi-channel acousto-optic modulator.

9. A spectrum analyzer according to claim 1, wherein said photodetector array comprises a two-dimensional photodetector having a two-dimensional array of light responsive pixels, and wherein said acousto-optic modulator comprises a multi-channel acousto-optic modulator, which is operative to modulate spatially adjacent portions of said light beam in accordance with a plurality of respective input signals, so that Fourier transformed, acousto-optically modulated beam portions are incident upon respectively spatially adjacent portions of said two-dimensional photodetector array.

10. A method of analyzing the frequency content of a signal comprising the steps of:
 (a) directing a coherent light beam upon an acousto-optic modulator which is operative to modulate said coherent light beam in accordance with an input signal applied thereto;
 (b) applying a signal the spectral content of which is to be ascertained to said acousto-optic modulator so that said coherent light beam is modulated in accordance with said signal the spectral content of which is to be ascertained;
 (c) disposing a Fourier transform lens system in the path of the light beam modulated in step (b) and imaging the light focussed by said Fourier transform lens system upon a photodetector array; and
 (d) reading out signals representative of the responses of respectively adjacent portions of said photodetector array, to provide output signals representative of whatever is the spectral content of said signal.

11. A method according to claim 10, wherein said photodetector array comprises a two-dimensional photodetector.

12. A method according to claim 10, wherein said acousto-optic modulator comprises a multi-channel acousto-optic modulator.

13. A method according to claim 10, wherein said photodetector array comprises a two-dimensional photodetector having a two-dimensional array of light responsive pixels, and wherein said acousto-optic modulator comprises a multi-channel acousto-optic modulator, which is operative to modulate spatially adjacent portions of said light beam in accordance with a plurality of respective input signals, so that Fourier transformed, acousto-optically modulated beam portions are incident upon respectively spatially adjacent portions of said two-dimensional photodetector array.

14. A method according to claim 13, wherein step (d) comprises transferring signals representative of the optical responses of the pixels of said plurality of respectively adjacent regions of said two-dimensional array to a further region of said array outside of the optical path of the modulated light beam incident thereon.

15. A method according to claim 14, wherein step (d) comprises coupling signals from of the pixels of a respective one of said adjacent portions of said further region of said two-dimensional photodetector array in parallel to an output accumulator register.

16. A method according to claim 15, wherein step (d) further includes coupling signals representative of the responses of respectively adjacent portions of said two-dimensional photodetector array to an output display device.

* * * * *